(12) United States Patent
Ganesan et al.

(10) Patent No.: US 11,694,959 B2
(45) Date of Patent: Jul. 4, 2023

(54) MULTI-DIE ULTRAFINE PITCH PATCH ARCHITECTURE AND METHOD OF MAKING

(71) Applicant: Intel Corporation, Santa Clara, CA (US)

(72) Inventors: Sanka Ganesan, Chandler, AZ (US); Kevin McCarthy, Tempe, AZ (US); Leigh M. Tribolet, Chandler, AZ (US); Debendra Mallik, Chandler, AZ (US); Ravindranath V. Mahajan, Chandler, AZ (US); Robert L. Sankman, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 826 days.

(21) Appl. No.: 16/524,748

(22) Filed: Jul. 29, 2019

(65) Prior Publication Data
US 2021/0035911 A1    Feb. 4, 2021

(51) Int. Cl.
*H01L 23/538* (2006.01)
*H01L 21/48* (2006.01)
(Continued)

(52) U.S. Cl.
CPC ........ *H01L 23/5381* (2013.01); *H01L 21/486* (2013.01); *H01L 21/4853* (2013.01);
(Continued)

(58) Field of Classification Search
CPC .................................................. H01L 23/5381
See application file for complete search history.

(56) References Cited

U.S. PATENT DOCUMENTS 9,379,090 B1 *   6/2016  Syed ................. H01L 23/49816
10,163,798 B1 * 12/2018  Alur ........................ H01L 24/16
(Continued)

FOREIGN PATENT DOCUMENTS

DE    102014116417         6/2015
WO    WO-2018182595 A1 * 10/2018 ......... H01L 21/4857

OTHER PUBLICATIONS

Https://www.taiyo-hd.co.jp/en/business/electronics/solderresist/;Taiyo Holdings; website accessed Feb. 2023, 1 page. (Year: 2023).*

(Continued)

*Primary Examiner* — John P. Dulka
(74) *Attorney, Agent, or Firm* — Schwabe, Williamson & Wyatt, P.C.

(57) ABSTRACT

Embodiments include semiconductor packages and methods to form the semiconductor packages. A semiconductor package includes a bridge over a glass patch. The bridge is coupled to the glass patch with an adhesive layer. The semiconductor package also includes a high-density packaging (HDP) substrate over the bridge and the glass patch. The HDP substrate is conductively coupled to the glass patch with a plurality of through mold vias (TMVs). The semiconductor package further includes a plurality of dies over the HDP substrate, and a first encapsulation layer over the TMVs, the bridge, the adhesive layer, and the glass patch. The HDP substrate includes a plurality of conductive interconnects that conductively couple the dies to the bridge and glass patch. The bridge may be an embedded multi-die interconnect bridge (EMIB), where the EMIB is communicatively coupled to the dies, and the glass patch includes a plurality of through glass vias (TGVs).

25 Claims, 9 Drawing Sheets

(51) Int. Cl.
- *H01L 21/56* (2006.01)
- *H01L 21/683* (2006.01)
- *H01L 23/31* (2006.01)
- *H01L 23/367* (2006.01)
- *H01L 23/498* (2006.01)
- *H01L 23/00* (2006.01)
- *H01L 25/065* (2023.01)
- *H01L 25/00* (2006.01)

(52) U.S. Cl.
CPC .......... *H01L 21/561* (2013.01); *H01L 21/568* (2013.01); *H01L 21/6835* (2013.01); *H01L 23/3128* (2013.01); *H01L 23/3675* (2013.01); *H01L 23/49816* (2013.01); *H01L 23/5384* (2013.01); *H01L 23/5386* (2013.01); *H01L 24/16* (2013.01); *H01L 24/17* (2013.01); *H01L 24/32* (2013.01); *H01L 24/73* (2013.01); *H01L 24/97* (2013.01); *H01L 25/0655* (2013.01); *H01L 25/50* (2013.01); *H01L 2221/68345* (2013.01); *H01L 2221/68359* (2013.01); *H01L 2224/16227* (2013.01); *H01L 2224/16238* (2013.01); *H01L 2224/1703* (2013.01); *H01L 2224/32225* (2013.01); *H01L 2224/73204* (2013.01)

(56) References Cited

U.S. PATENT DOCUMENTS

| | | | |
|---|---|---|---|
| 10,950,550 B2 * | 3/2021 | Qian | .................. H01L 23/5385 |
| 2011/0304999 A1 | 12/2011 | Yu | |
| 2014/0070380 A1 | 3/2014 | Chiu | |
| 2018/0166354 A1 | 6/2018 | Imayoshi | |

OTHER PUBLICATIONS

Search Report from European Patent Application No. 20162682.7, dated Sep. 29, 2020, 6 pgs.

* cited by examiner

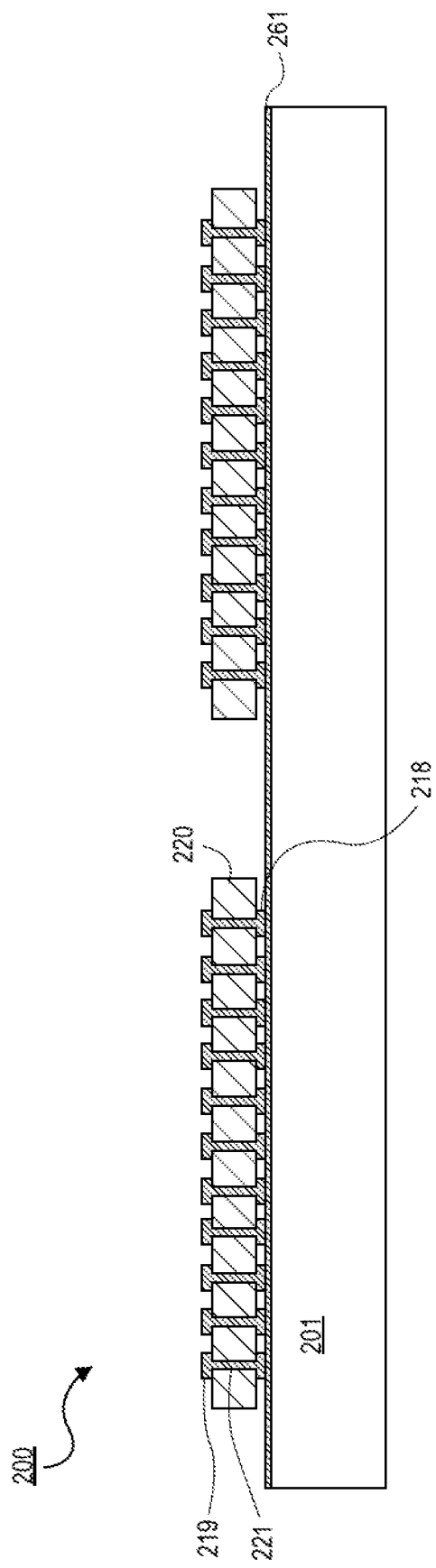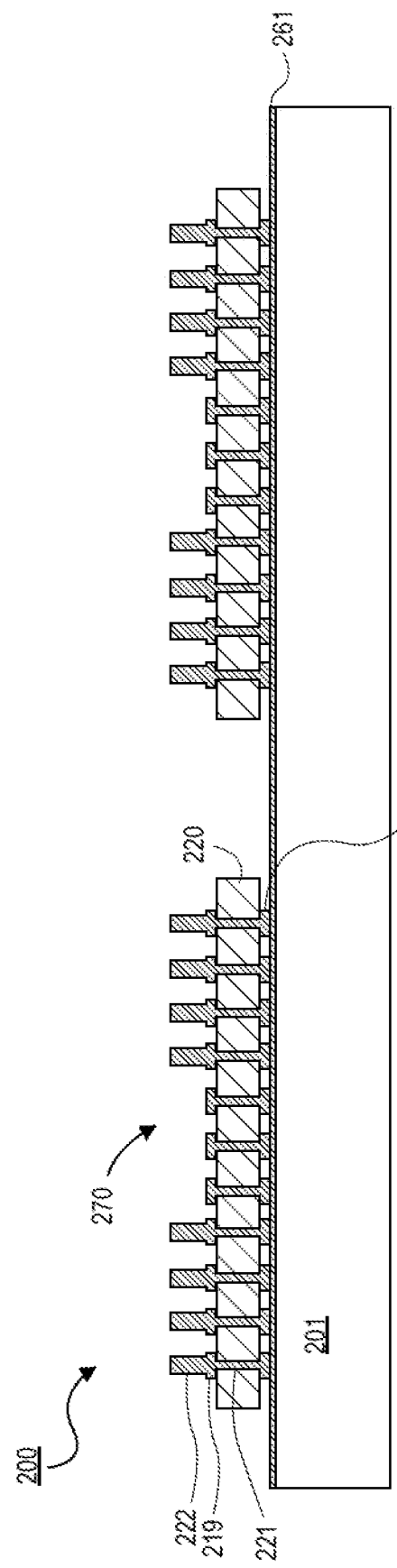

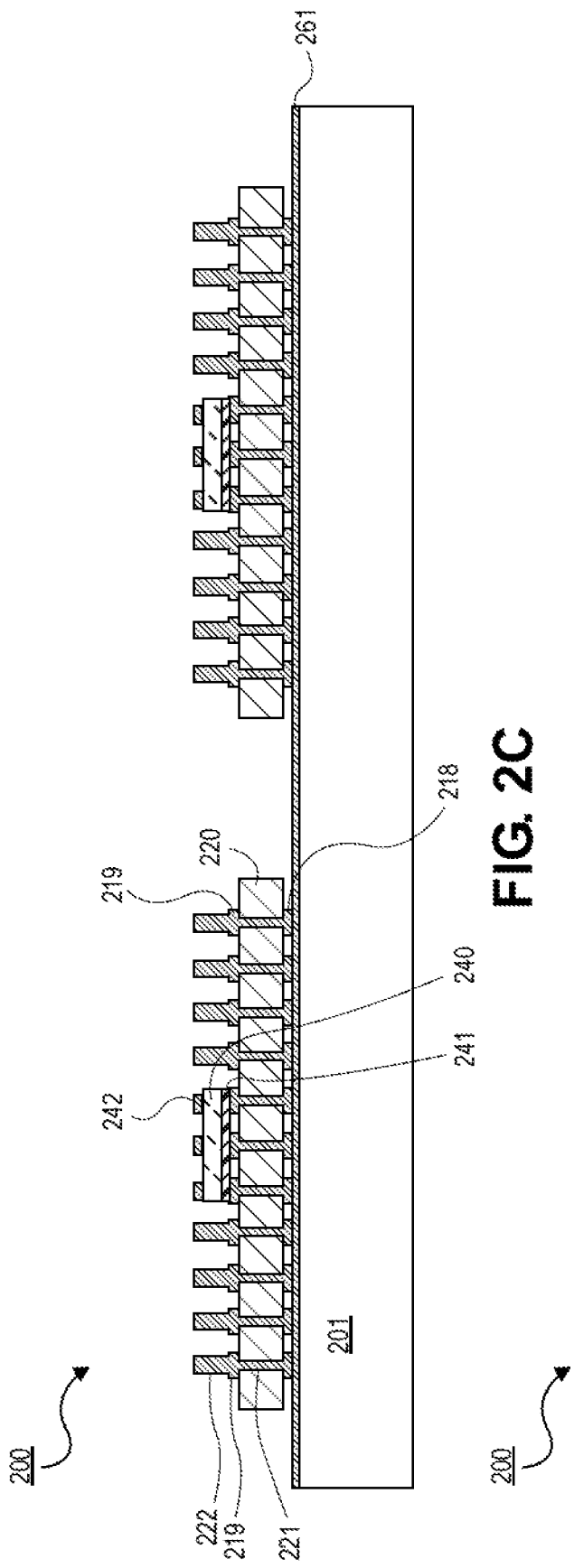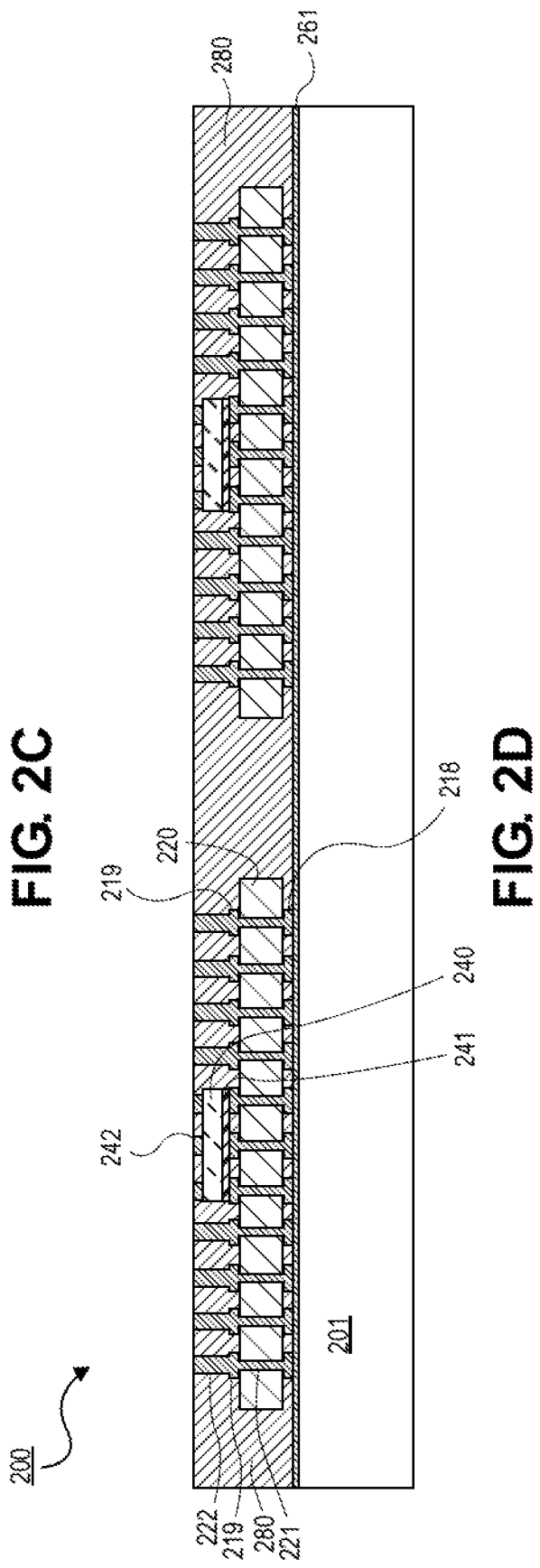

MULTI-DIE ULTRAFINE PITCH PATCH ARCHITECTURE AND METHOD OF MAKING

FIELD

Embodiments relate to packaging semiconductor devices. More particularly, the embodiments relate to semiconductor devices with package substrates that include multi-die ultrafine pitch patch architectures.

BACKGROUND

For the past several decades, the scaling of features in integrated circuits (ICs) has been a driving force behind an ever-growing semiconductor industry. Scaling to smaller and smaller features enables increased densities of functional units on the limited real estate of semiconductor devices. The drive to scale-down features in ICs, while optimizing the performance of each device, however is not without issue.

For the data centric businesses, heterogeneous integration of multiple chips/dies in a package is essential. Interconnecting these chips at the lowest power and at high bandwidth density drives ultrafine line/space/via pads on package substrates. Recently, embedded bridge die technology addresses this need in server products. However, with ever increasing demands for multi-die interconnects, package substrates are required to embed extraneous bridge dies (e.g., greater than 10 bridge dies) to accommodate these multiple dies and multi-die interconnects. More importantly, the package assembly processes for such package substrates also require attaching multiple dies with solder to these extraneous bridge die areas, and desired results with high yields and increased bridge die bump pitches. Such processes, however, need additional assembly steps and time, and require precise control of substrate flatness over large areas of these packages.

This limits the bridge die bump pitches for solder-based embedded bridge die connections. These limitations on the bridge die bump pitches result in several major packaging issues including less than desired bump densities, which further results in increased interconnect physical areas in the die and increased costs for such increased silicon area. Furthermore, existing technologies have also used silicon interposers as an attempt to solve these pitch scaling limitations and issues. For multi-die architectures, silicon interposers can have sizes that exceed two-times (or more) the reticle size, which therefore requires stitching of reticles but with excessive costs and added complexities.

BRIEF DESCRIPTION OF THE DRAWINGS

Embodiments described herein illustrated by way of example and not limitation in the figures of the accompanying drawings, in which like references indicate similar features. Furthermore, some conventional details have been omitted so as not to obscure from the inventive concepts described herein.

FIGS. 2A-2J are illustrations of cross-sectional views of a process flow to form a semiconductor package with a plurality of dies, a HDP substrate, a bridge, a glass patch, and a package substrate, according to some embodiments.

DETAILED DESCRIPTION

Figure 1:
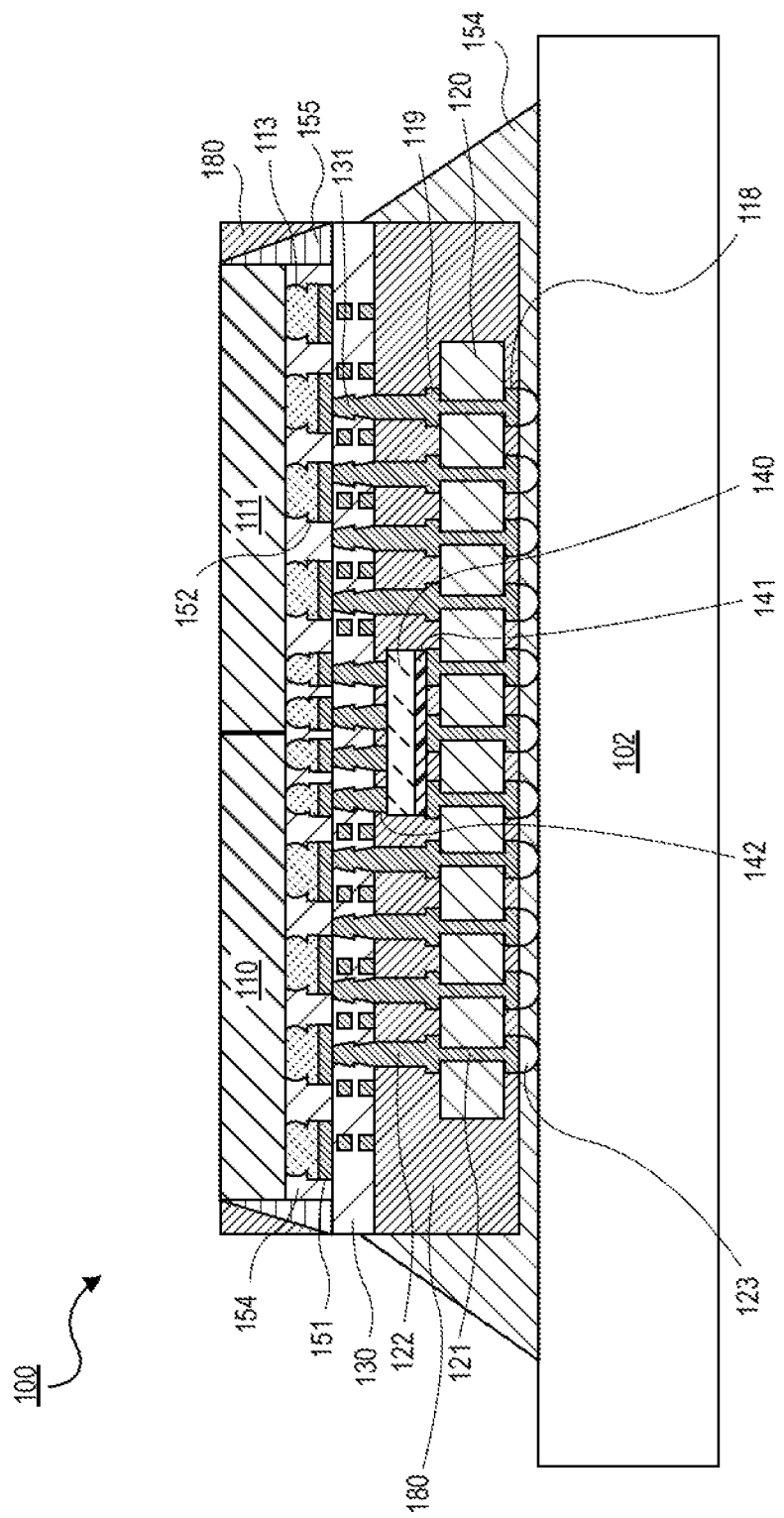
FIG. 1 is an illustration of a cross-sectional view of a semiconductor package with a plurality of dies, a high-density packaging (HDP) substrate, a bridge, a glass patch, and a package substrate, according to one embodiment.

Described herein are semiconductor packages with package substrates and multi-die ultrafine pitch patch architectures and methods of forming such semiconductor packages. The semiconductor packages described below and methods of forming such semiconductor packages may include a plurality of dies, a high-density packaging (HDP) substrate, a bridge, a glass patch, and a package substrate, according to some embodiments. These embodiments of the semiconductor packages described herein implement and combine the HDP substrate (e.g., a high-density (HD)-organic substrate) and the bridge (e.g., embedded multi-die interconnect bridge (EMIB)) without solder connections on the glass patch with through glass vias (TGVs).

As described herein, a "glass patch" may refer to a multilayer glass package substrate implemented with TGVs and advanced substrate design rules. The design rules may be compatible with the latest silicon nodes. For example, these design rules allow dies, bridges, and so on to be assembled on a glass patch with an ultrafine pitch of roughly or less than 30 um. In some embodiments, the glass patch described herein may include a plurality of conductive interconnects that enable coupling one or more bridges to a HDP substrate and one or more dies, where the conductive interconnects may be comprised of one or more metallic materials such as copper, titanium, palladium, and/or the like, and where such conductive interconnects may include pads, TGVs, traces, and/or the like.

Furthermore, the glass patch described herein helps the semiconductor package by substantially reducing (or eliminating/mitigating) the total number of bridges that are typically needed as described above with existing technologies. The glass patch described below may enable improved routing and power delivery functions for the semiconductor package. The glass patch described herein provides improved warpage benefits for the semiconductor package. For example, the coefficient of thermal expansion (CTE) of the glass patch may be substantially equal to the CTE of the silicon in the semiconductor package. Additionally, the CTE of the glass patch may be modulated to substantially reduce the thermal stresses on the semiconductor package, according to some embodiments.

The embodiments described herein provide improvements to existing packaging solutions by eliminating the solder-based bridge interconnects (i.e., the EMIBs described herein may be coupled to another component without solder connections) to thereby provide improved bridge pitch scaling, reduced interconnect physical area on the dies, and lowered assembly costs. Also, another improvement to existing packaging solutions include eliminating the need for expensive silicon interposer to thereby reduce the overall package cost. These semiconductor packages further provide improvements to packaging solutions by implementing and combining solder-less bridge (or EMIB) interconnects, bridge-to-glass patch hybrid bonding (e.g., $SiO_2$/Cu bonding), HDP substrate routing layers with substantially reduced line/spacing (L/S) (e.g., L/S of less than 2/2), ultrafine lithographically-defined vias, and zero-misaligned via architectures.

The technologies described herein may be implemented in one or more electronic devices. Non-limiting examples of electronic devices that may utilize the technologies described herein include any kind of mobile device and/or stationary device, such as microelectromechanical systems (MEMS) based electrical systems, gyroscopes, advanced driving assistance systems (ADAS), 5G communication systems, cameras, cell phones, computer terminals, desktop computers, electronic readers, facsimile machines, kiosks, netbook computers, notebook computers, interne devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. Such devices may be portable or stationary. In some embodiments, the technologies described herein may be employed in a desktop computer, laptop computer, smart phone, tablet computer, netbook computer, notebook computer, personal digital assistant, server, combinations thereof, and the like. More generally, the technologies described herein may be employed in any of a variety of electronic devices, including semiconductor packages with package substrates, dies, HDP substrates, bridges (or EMIBs), and glass patches with TGVs.

In the following description, various aspects of the illustrative implementations will be described using terms commonly employed by those skilled in the art to convey the substance of their work to others skilled in the art. However, it will be apparent to those skilled in the art that the present embodiments may be practiced with only some of the described aspects. For purposes of explanation, specific numbers, materials and configurations are set forth in order to provide a thorough understanding of the illustrative implementations. However, it will be apparent to one skilled in the art that the present embodiments may be practiced without the specific details. In other instances, well-known features are omitted or simplified in order not to obscure the illustrative implementations.

Various operations will be described as multiple discrete operations, in turn, in a manner that is most helpful in understanding the present embodiments, however, the order of description should not be construed to imply that these operations are necessarily order dependent. In particular, these operations need not be performed in the order of presentation.

As used herein the terms "top," "bottom," "upper," "lower," "lowermost," and "uppermost" when used in relationship to one or more elements are intended to convey a relative rather than absolute physical configuration. Thus, an element described as an "uppermost element" or a "top element" in a device may instead form the "lowermost element" or "bottom element" in the device when the device is inverted. Similarly, an element described as the "lowermost element" or "bottom element" in the device may instead form the "uppermost element" or "top element" in the device when the device is inverted.

Referring now to FIG. 1, a cross-sectional illustration of a semiconductor package 100 is shown, in accordance with an embodiment. In an embodiment, the semiconductor package 100 may include a plurality of dies 110-111, a HDP substrate 130, a bridge 140, a glass patch 120, and a package substrate 102. For one embodiment, the semiconductor package 100 may combine the HDP substrate 130 and the bridge 140 to conductively couple the dies 110-111 to the glass patch 120 and the package substrate 102. That is, according to some embodiments, the dies 110-111 may be disposed over the HDP substrate 130, and the HDP substrate 130 may be disposed over the bridge 140 and the glass patch 120, while the glass patch 120 may be disposed over the package substrate 102.

For one embodiment, the glass patch 120 may include a plurality of first conductive pads 118, a plurality of second conductive pads 119, and a plurality of TGVs 121. In one embodiment, the glass patch 120 may be comprised of glass, crystal, and/or any similar material, where the first and second conductive pads 118-119 and the TGVs 121 may be comprised of copper and/or the like. For one embodiment, the glass patch 120 may have a footprint (or an x-y area) of approximately or less than 40 mm×40 mm. In one embodiment, the glass patch 120 may have a thickness of approximately 300 um to 400 um. In another embodiment, the glass patch 120 may have a thickness of less than 300 um.

The second conductive pads 119 may be disposed on the top surface of the glass patch 120, and the first conductive pads 118 may be disposed on the bottom surface of the glass patch 120. The TGVs 121 of the glass patch 120 may vertically extend from the bottom surface to the top surface of the glass patch 120, where the TGVs 121 may conductively couple the first conductive pads 118 to the second conductive pads 119. Furthermore, the first conductive pads 118 of the glass patch 120 may be disposed on and conductively coupled to the top surface of the package substrate 102 with a plurality of first solder balls 123.

In one embodiment, the bridge 140 may include an adhesive layer 141 and a plurality of third conductive pads 142. The third conductive pads 142 may be disposed on the top surface of the bridge 140, while the adhesive layer 141 may be disposed and coupled onto the bottom surface of the bridge 140. For one embodiment, the bridge 140 may have a thickness of approximately 10 um to 70 um. In one embodiment, the bridge 140 may have a pitch of approximately or less than 30 um. Likewise, in another embodiment, the third conductive pads 142 of the bridge 140 may have a thickness of approximately or less than 20 um. For one embodiment, the bridge 140 may be disposed over the second conductive pads 119 of the glass patch 120, where the bridge 140 is coupled to the second conductive pads 119 of the glass patch 120 with the adhesive layer 141. Additionally, a plurality of through mold vias (TMVs) 122 may be conductively coupled to the second conductive pads 119 of the glass patch 120. The TMVs 122 may extend vertically from the second conductive pads 119 to the bottom surface of HDP substrate 130.

In an embodiment, the bridge 140 may communicatively couple the dies 110-111 and the HDP substrate 130, which are positioned above the bridge 140, to the glass patch 120 and the package substrate 102, which are positioned below the bridge 140. In an embodiment, the bridge 140 may comprise electrical routing (or interconnect structures) to communicative couple the first die 110 to the second die 111 through the HDP substrate 130. As described above, the bridge 140 does not need solder balls to be coupled to the glass patch 120 (and/or the HDP substrate 130), instead the bridge 140 is coupled onto the glass patch 120 with the adhesive layer 141 (or an adhesive film). In an embodiment, the bridge 140 may be a silicon bridge or a bridge made of any other substrate material that is suitable for forming bridges. In some embodiments, the bridge 140 may be referred to as an EMIB. For additional embodiments, the bridge 140 may include a plurality of through silicon vias (TSVs) that may be further used to couple the bridge 140 to the HDP substrate 130 and/or the glass carrier 120.

For one embodiment, an encapsulation layer 180 may be disposed over the TMVs 122, the bridge 140 with the adhesive layer 141 and the third conductive pads 142, and the glass patch 120 with the first and second conductive pads 118-119. As such, the TMVs 122 may be surrounded with the encapsulation layer 180, and may extend vertically through the encapsulation layer 180. Also, the encapsulation layer 180 may be disposed over a first underfill material 154 (or a first underfill layer). In one embodiment, the first underfill material 154 may be disposed over the top surface of the package substrate 102, where the first underfill material 154 may surround (or embed) the encapsulation layer 180 and the first solder balls 123 that are disposed between the encapsulation layer 180 and the package substrate 102. In one embodiment, the encapsulation layer 180 may include one or more encapsulation materials such as a mold material, an underfill material, a filler material, any similar material(s), and/or any combination thereof. For one embodiment, the encapsulation layer 180 may be planarized as the top surface of the encapsulation layer 180 may be substantially coplanar to the top surfaces of the TMVs 122 and the third conductive pads 142.

Accordingly, the HDP substrate 130 may be disposed over the encapsulation layer 180, the bridge 140, and the glass patch 120. In one embodiment, the HDP substrate 130 may have a plurality of conductive interconnects 131 that may include vias, traces, lines, pads, or the like. For example, the HDP substrate 130 may include a plurality of redistribution layers (RDLs) comprised of traces with L/S of approximately or less than 2/2 um, lithographically-defined vias, zero-misalignment vias, and/or via pads with thicknesses of approximately or less than 18 um. The HDP substrate 130 may be a silicon substrate having increased (or high) input/output (I/O) density and bandwidth for the communication between the dies 110-111 and the bridge 140. The HDP substrate 130 may include high-density solder bumps and fine conductive traces that create high-density interconnects between the dies 110-111, the bridge 140, and the glass patch 120. In one embodiment, the HDP substrate 130 may have a thickness of approximately 10 um to 200 um.

Furthermore, in some embodiments, a plurality of fourth conductive pads 151 may be disposed on the top surface of the HDP substrate 130. In one embodiment, a surface finish layer 152 may be disposed directly on the fourth conductive pads 151. For one embodiment, the surface finish layer 152 may include one or more conductive materials that may provide extra solder such as tin or the like. In one embodiment, the conductive interconnects 131 of the HDP substrate 130 may conductively couple the fourth conductive pads 151 to the interconnects 122, the third conductive pads 142 of the bridge 140, and the second conductive pads 119 of the glass patch 120.

In some embodiments, the fourth conductive pads 151 may have a thickness of approximately or less than 12 um, where the fourth conductive pads 151 may have a first width for a portion of the fourth conductive pads 151 that are coupled directly to (and positioned above) the bridge 140, and a second width for the remaining portion of the fourth conductive pads 151 that are coupled directly to the glass patch 120 and positioned above the glass patch 120 and the package substrate 102. In these embodiments, the first width of the fourth conductive pads 151 may be less than the second width of the fourth conductive pads 151.

As shown in FIG. 1, the dies 110-111 may include the first die 110 and the second die 111. The first and second dies 110-111 may be disposed over the HDP substrate 130. The first and second dies 110-111 may be conductively coupled to the fourth conductive pads 151 and the surface finish layer 152 with a plurality of second solder balls 113. For one embodiment, the first and second dies 110-111 may include, but are not limited to, a semiconductor die, an electronic device (e.g., a wireless device), an integrated circuit (IC), a central processing unit (CPU), a microprocessor, a platform controller hub (PCH), a memory (e.g., a high-bandwidth memory (HBM)), and/or a field-programmable gate array (FPGA). The first and second dies 110-111 may be formed from a material such as silicon and have circuitry thereon that is to be coupled to the HDP substrate 130.

For one embodiment, the underfill material 154 may also be disposed between the bottom surfaces of the first and second dies 110-111 and the top surface of the HDP substrate 130. The underfill material 154 may surround (or embed) the second solder balls 113, the surface finish layer 152, and the fourth conductive pads 151. Furthermore, in an additional embodiment, a second underfill material 155 may be disposed over the top surface of the HDP substrate 130, where the second underfill material 155 may surround the first and second dies 110-111 and the underfill material 154 (or the first underfill material). Note that, in one embodiment, the first and second underfill materials 154-155 include the same underfill materials, and, in alternate embodiment, the first and second underfill materials 154-155 may include one or more different underfill materials.

Additionally, the encapsulation layer 180 may also be disposed over the first and second dies 110-111 and the first and second underfill materials 154-155. For one embodiment, the encapsulation layer 180 may be planarized as the top surface of this respective encapsulation layer 180 may be substantially coplanar to the top surfaces of the first and second dies 110-111. In additional embodiments, a thermal solution (or thermal device) may be disposed over the top surfaces of the dies 110-111 and the encapsulation layer 180, where the thermal solution may include a heatsink, an integrated heat spreader (IHS), a manifold, a cold plate, and/or the like. Accordingly, the stack of the dies 110-111, the HDP substrate 130, the bridge 140, and the glass patch 120 may be disposed over (and coupled to) the package substrate 102. Note that while one HDP substrate 130, one bridge 140, one glass patch 120, and two dies 110-111 are illustrated in FIG. 1, it is to be appreciated that any number of HDP substrates 130, bridges 140, glass patches 120, and dies 110-111 may be combined with, disposed on/over, and coupled to the package substrate 102.

For one embodiment, the package substrate 102 may include, but is not limited to, a package, a substrate, a printed circuit board (PCB), and/or a motherboard. For one embodiment, the package substrate 102 is a PCB. For one embodiment, the PCB is made of an FR-4 glass epoxy base with thin copper foil laminated on both sides. For certain embodiments, a multilayer PCB can be used, with pre-preg and copper foil used to make additional layers. For example, the multilayer PCB may include one or more dielectric layers, where each dielectric layer may be a photosensitive dielectric layer. For one embodiment, the PCB 102 may include a plurality of conductive layers, which may further include copper (or metallic) traces, lines, pads, vias, via pads, holes, and/or planes.

Note that the semiconductor package 100 may include fewer or additional packaging components based on the desired packaging design.

FIGS. 2A-2J are illustrations of cross-sectional views of a process flow to form a semiconductor package 200, in accordance with an embodiment. In an embodiment, the semiconductor package 200 may include a plurality of dies 210-211, a HDP substrate 230, a bridge 240, a glass patch 220, and a package substrate 202, according to some embodiments. The process flow illustrated in FIGS. 2A-2J forms the semiconductor package 200 that is substantially similar to the semiconductor package 100 described above in FIG. 1. Likewise, the components of the semiconductor package 200 are substantially similar to the components of the semiconductor package 100 described above in FIG. 1. Accordingly, as described above, the process flow of the package substrate 200 illustrates one of the approaches to implement (and/or stack, combine, couple, etc.) the HDP substrate 230 and the bridge 240—without solder connections—with ultrafine interconnecting/routing pitches, and disposing the stack of the HDP substrate 230 and the bridge 240 over the glass patch 220 with the TGVs 221.

Referring now to FIG. 2A, a cross-sectional illustration of a semiconductor package 200 is shown, in accordance with an embodiment. In an embodiment, the semiconductor package 200 may include an adhesive layer 261 (or an adhesive film, a bonding film, etc.) disposed on a carrier 201. For one embodiment, the carrier 261 may be a glass carrier (or a temporary glass panel carrier), a metal carrier, and/or any similar flat and rigid carrier/substrate.

Additionally, in one embodiment, a plurality of glass patches 220 may be disposed over the adhesive layer 261 and the carrier 201, where the glass patches 220 may be positioned adjacent to each other and coupled to the carrier 201 with the adhesive layer 261. The glass patches 220 may be substantially similar to the glass patch 120 described above in FIG. 1. As such, the glass patches 220 may have a plurality of first conductive pads 218, a plurality of second conductive pads 219, and a plurality of TGVs 221. Furthermore, as shown in FIG. 2A, the first conductive pads 218 may be directly disposed on the adhesive layer 261 to couple the glass patches 220 to the carrier 201.

Referring now to FIG. 2B, a cross-sectional illustration of a semiconductor package 200 is shown, in accordance with an embodiment. In an embodiment, a seed layer may be disposed over the second conductive pads 219 of the glass patch 220. In one embodiment, the seed layer may include copper, titanium, any combination thereof, and/or the like. In an embodiment, the seed layer may be formed with a sputtering process or the like.

After the seed layer disposition, a resist layer may be disposed (or exposed/developed) over the second conductive pads 219 of the glass patches 220. In an embodiment, the resist layer may be a dry-film resist (DFR) or the like. In an embodiment, the resist layer may be patterned to form via openings with a lithographic process, a laser drilling process, or the like. The via openings may expose one or more of the top surfaces of the second conductive pads 219 of the glass patches 220, while covering the other top surfaces of the second conductive pads 219 to subsequently form one or more cavities over the glass patches 220.

In some embodiments, a plurality of TMVs 222 may be disposed (or plated/formed) over the one or more exposed top surfaces of the second conductive pads 219. The TMVs 222 may be referred to as conductive/metallic pillars. The TMVs 222 may be substantially similar to the TMVs 122 described above in FIG. 1. In an embodiment, the TMVs 222 may be over-plated over the top surface of the resist layer in order to ensure complete filling of the via openings in the resist layer. For one embodiment, the TMVs 222 may vertically extend from the top surfaces of the second conductive pads 219 to the top surface of the resist layer. In an embodiment, the TMVs 222 may be formed with an electroplating process or the like.

In an embodiment, when the TMVs 222 are over-plated, the over-plated TMVs 222 may be planarized so that the top surfaces of the TMVs 222 are substantially coplanar with the top surface of the resist layer. This planarization process also enables the TMVs 222 to have substantially the same thicknesses as each other, thereby reducing the thickness variation of the semiconductor package 200. In an embodiment, the planarization may be implemented with a chemical mechanical planarization (CMP) process or the like. The planarization process may have a high degree of accuracy due to the presence of the resist layer that serves as a stopping point. Lastly, the resist layer may be stripped with any suitable process, such as ashing, wet stripping, or the like. After removing the resist layer, the remaining second conductive pads 219 may be exposed to form a plurality of cavities 270 over the glass patches 220. As shown in FIG. 2B, the cavities 270 provide openings over the exposed second conductive pads 219 that are surrounded with the TMVs 222, where such cavities 270 may be used to subsequently house the bridges described below in a subsequent processing step (e.g., the bridges 240 of FIG. 2C).

Referring now to FIG. 2C, a cross-sectional illustration of a semiconductor package 200 is shown, in accordance with an embodiment. In an embodiment, a plurality of bridges 240 may be disposed into the cavities 270 (as shown in FIG. 2B) and coupled onto the exposed second conductive pads 219 with an adhesive layer 241. The bridges 240 may be substantially similar to the bridges 140 described above in FIG. 1. Additionally, a plurality of third conductive pads 242 may be disposed on the top surfaces of the bridges 240. In one embodiment, the third conductive pads 242 may have top surfaces that are substantially coplanar to the top surfaces of the TMVs 222.

Referring now to FIG. 2D, a cross-sectional illustration of a semiconductor package 200 is shown, in accordance with an embodiment. For one embodiment, an encapsulation layer 280 may be disposed over the TMVs 222, the bridges 240, the glass patches 220, and the adhesive layer 261. In an embodiment, the encapsulation layer 280 may be disposed to cover the top surfaces of the TMVs 222 and the third conductive pads 242. In one embodiment, the encapsulation layer 280 may be a mold layer and/or any similar encapsulation material(s). For one embodiment, the mold layer 280 may include an epoxy (e.g., a soft epoxy, a stiff epoxy, opaque epoxy, etc.) with one or more filler materials. In an embodiment, the encapsulation layer 280 may be compression molded, laminated, or the like.

The encapsulation layer 280 may be substantially similar the encapsulation layer 180 described above in FIG. 1. In an embodiment, the encapsulation layer 280 may be planarized (or grinded) so that the top surfaces of the TMVs 222 are substantially coplanar with the top surface of the encapsulation layer 280. Additionally, the encapsulation layer 280 is planarized/grinded to expose the top surfaces of the TMVs 222 and the third conductive pads 242. In an embodiment, the planarization may be implemented with a CMP process or the like.

Figure 2E:
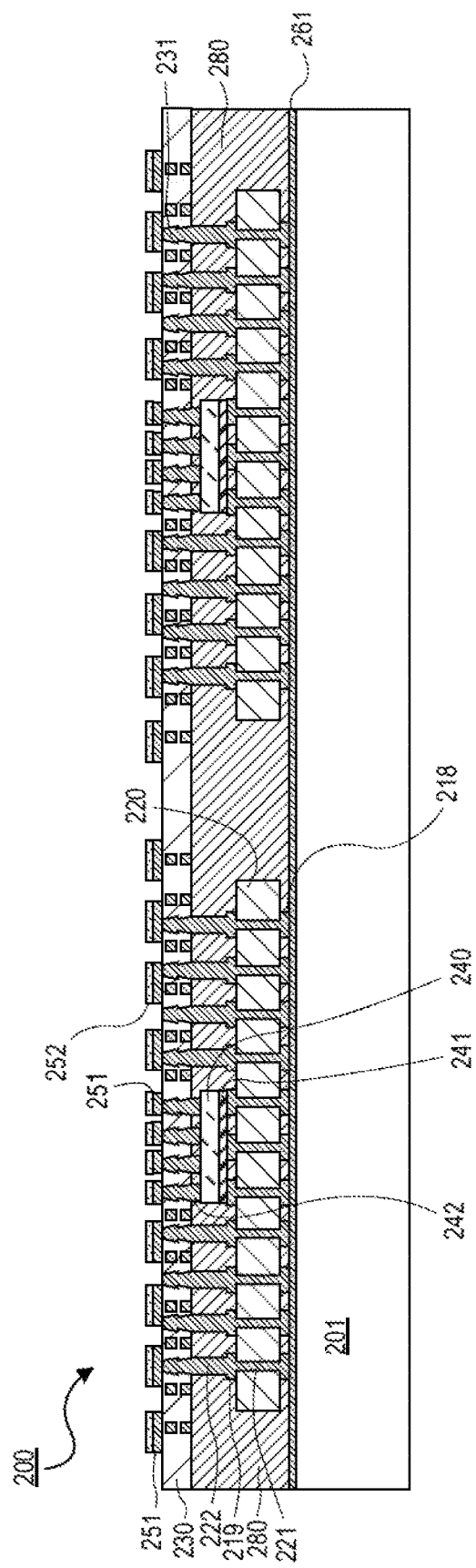

Referring now to FIG. 2E, a cross-sectional illustration of a semiconductor package 200 is shown, in accordance with an embodiment. In an embodiment, a HDP substrate 230 may be disposed over the top surfaces of the encapsulation layer 280, the TMVs 222, and the third conductive pads 242. The HDP substrate 230 may be substantially similar to the HDP substrate 130 described above in FIG. 1. As such, the HDP substrate 230 may also include a plurality of conductive interconnects 231. The conductive interconnects 231 of the HDP substrate 230 may conductively couple the TMVs 222 and the third conductive pads 242 to a plurality of fourth conductive pads 251.

In one embodiment, the fourth conductive pads 251 may be disposed on the HDP substrate 230. Furthermore, a surface finish layer 252 may be disposed over the top surfaces of the fourth conductive pads 251, where the surface finish layer 252 may be tin, palladium, or the like, and where the surface finish layer 252 may have a thickness of approximately 5 um to 10 um. Also, as described above, the HDP substrate 230 may include one or more RDL layers with conductive traces (or lines) having an L/S of approximately or less than 2/2, lithographically-defined vias, zero-misalignment vias, and/or approximately or less than 18 um via pads. In one embodiment, the HDP substrate 230 may have a first portion of the fourth conductive pads 251 that have a pitch of approximately 50 um to 70 um (or less than 50 um), and a thickness of approximately 10 um to 12 um, and that are positioned on the non-bridge interface (i.e., the first portion of the fourth conductive pads 251 are not positioned over the bridges 240). Likewise, in another embodiment, the HDP substrate 230 may have a second portion (or the remaining portion) of the fourth conductive pads 251 that have a pitch of approximately 12 um to 15 um (or less than 12 um), and a thickness of approximately 10 um to 12 um, and that are positioned on the bridge interface (i.e., the second/remaining portion of the fourth conductive pads 251 are positioned directly over the bridges 240).

Figure 2F:
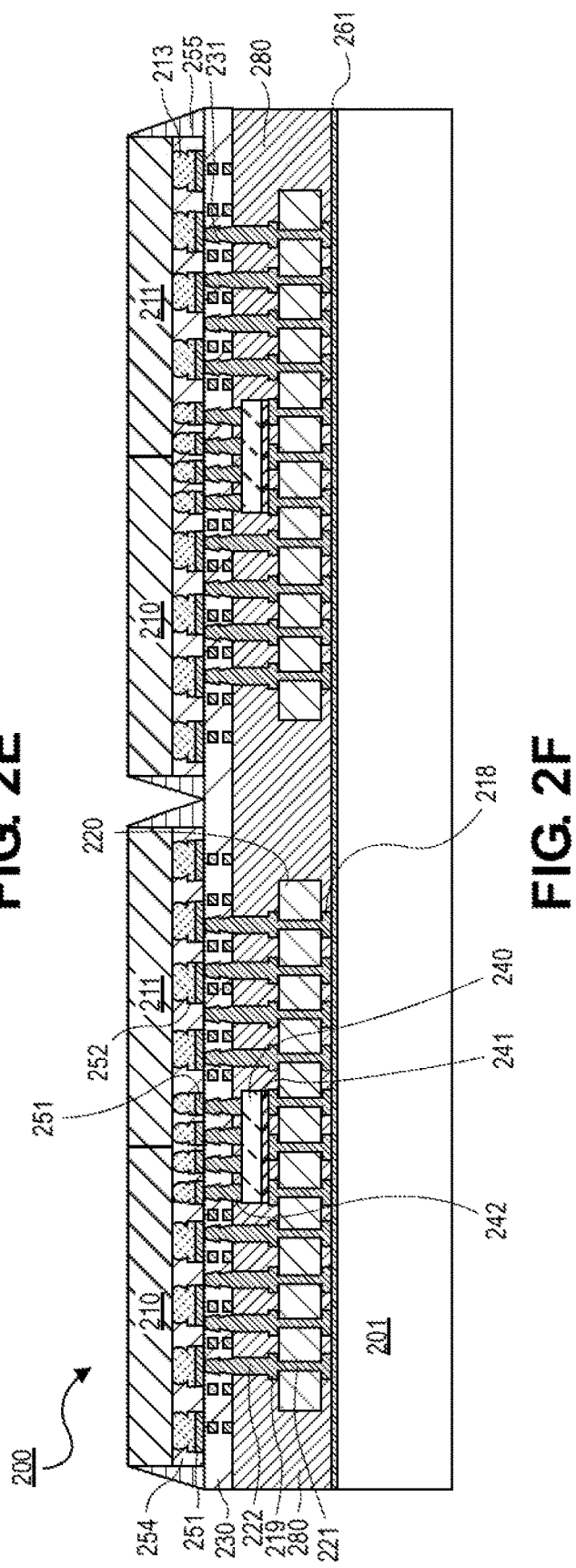

Referring now to FIG. 2F, a cross-sectional illustration of a semiconductor package 200 is shown, in accordance with an embodiment. In an embodiment, a plurality of dies 210-211 disposed over the HDP substrate 230. The dies 210-211 are conductively coupled to the fourth conductive pads 251 and the surface finish layer 252 with a plurality of second solder balls 213. In one embodiment, the dies 210-211 may have a pitch of approximately or less than 36 um. The dies 210-211 may be substantially similar to the dies 110-111 described above in FIG. 1. Additionally, as shown in FIG. 2F, a first underfill layer 254 may be disposed between the dies 210-211 and the HDP substrate 230, where the first underfill layer 254 may surround the second solder balls 213, the fourth conductive pads 251, and the surface finish layer 252. Likewise, a second underfill layer 255 may be disposed over and/or around the dies 210-211 and the HDP substrate 230, where the second underfill layer 255 may surround the outer edges of the dies 210-211 and the first underfill layer 254. The first and second underfill layers 254-255 may be substantially similar to the first and second underfill layers 154-155 described above in FIG. 1.

Figure 2G:
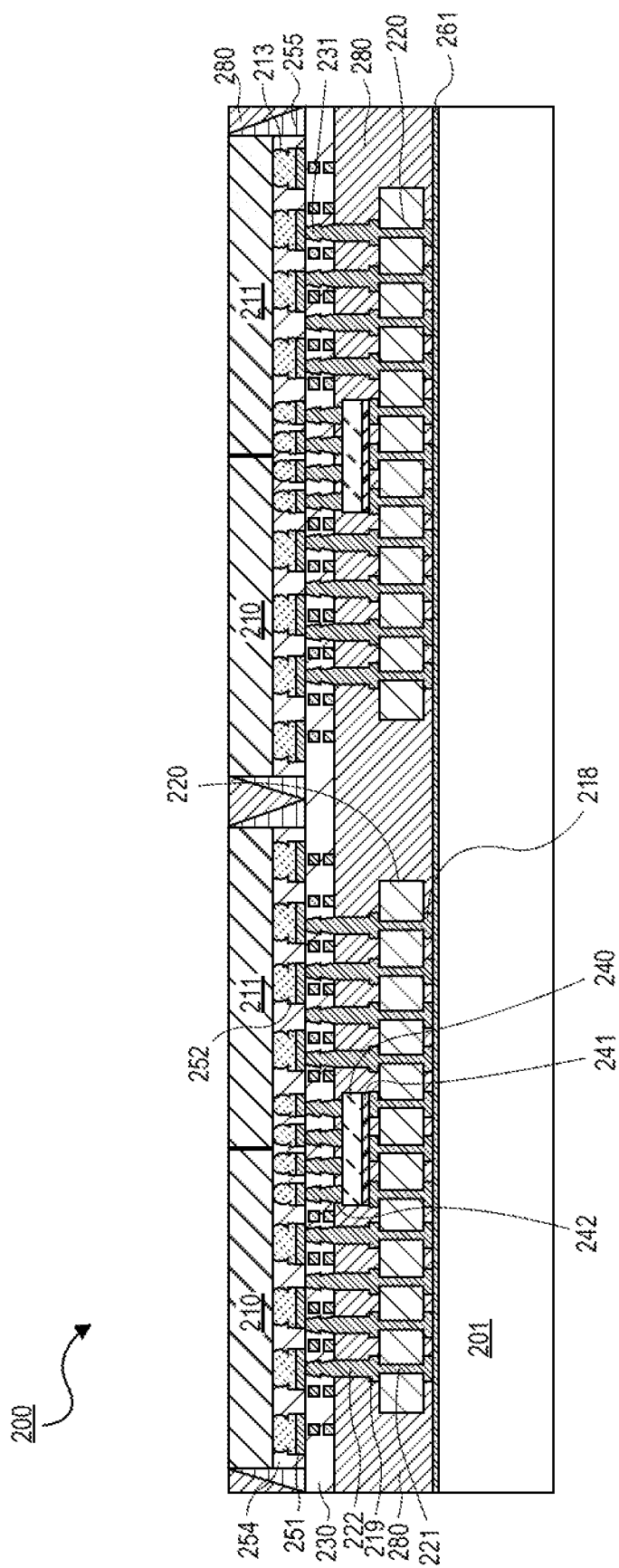

Referring now to FIG. 2G, a cross-sectional illustration of a semiconductor package 200 is shown, in accordance with an embodiment. In an embodiment, the encapsulation layer 280 may be disposed over the dies 210-211, the first and second underfill layers 254-255, and the HDP substrate 230. In an embodiment, the encapsulation layer 280 may be disposed to cover the top surfaces of the dies 210-211. The encapsulation layer 280 of FIG. 2G may be substantially similar to the encapsulation layer 280 described above in FIG. 2D.

In an embodiment, the encapsulation layer 280 may be planarized (or grinded) so that the top surfaces of the dies 210-211 are substantially coplanar with the top surface of the encapsulation layer 280. Additionally, the encapsulation layer 280 may be planarized/grinded to expose the top surfaces of the dies 210-211. In an embodiment, the planarization may be implemented with a CMP process or the like. Additionally, as described above, a thermal solution (e.g., a heat sink, an IHS, etc.) may be disposed on the exposed top surfaces of the dies 210-211 to further reduce the overall temperature (or thermal stresses) of the semiconductor package 200.

Figure 2H:
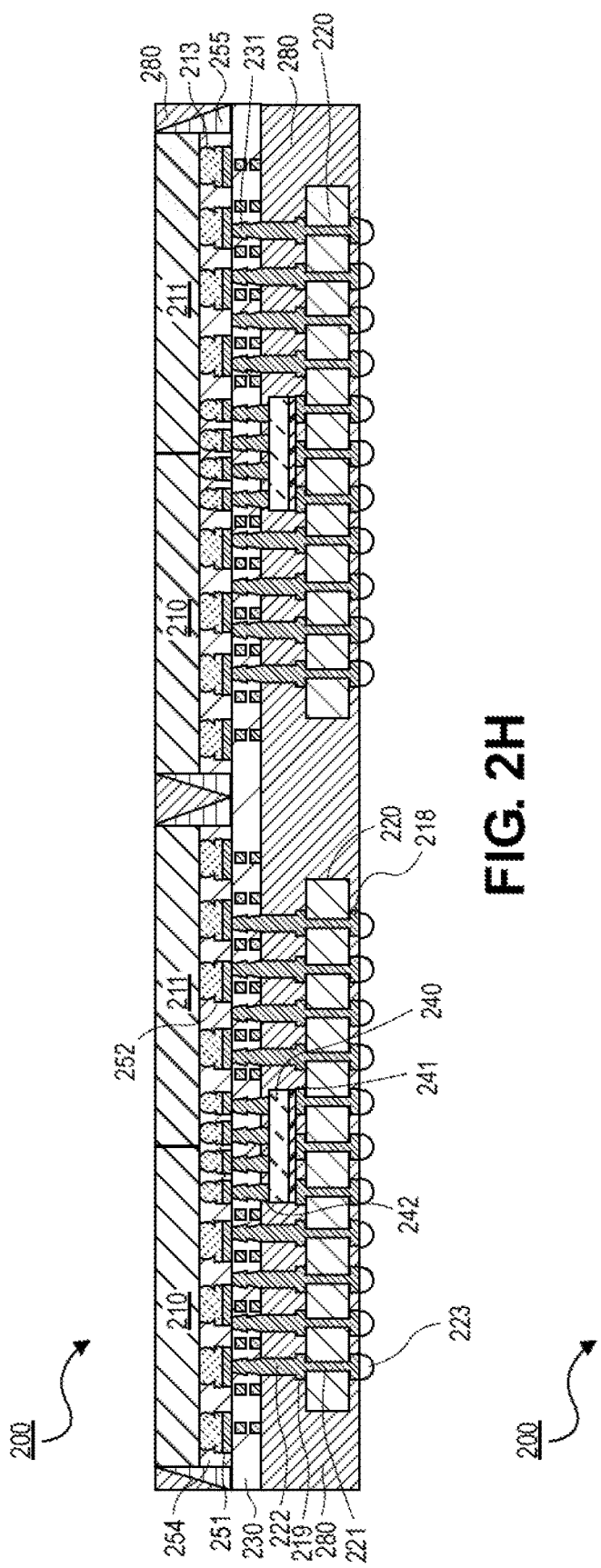

Referring now to FIG. 2H, a cross-sectional illustration of a semiconductor package 200 is shown, in accordance with an embodiment. In an embodiment, the carrier and the adhesive layer may be removed from below the encapsulation layer 280 and the glass patches 220 to expose the bottom surfaces of the first conductive pads 218 of the glass patches 220. Additionally, a plurality of first solder balls 223 may be disposed and coupled onto the exposed bottom surfaces of the first conductive pads 218 of the glass patches 220.

Figure 2I:
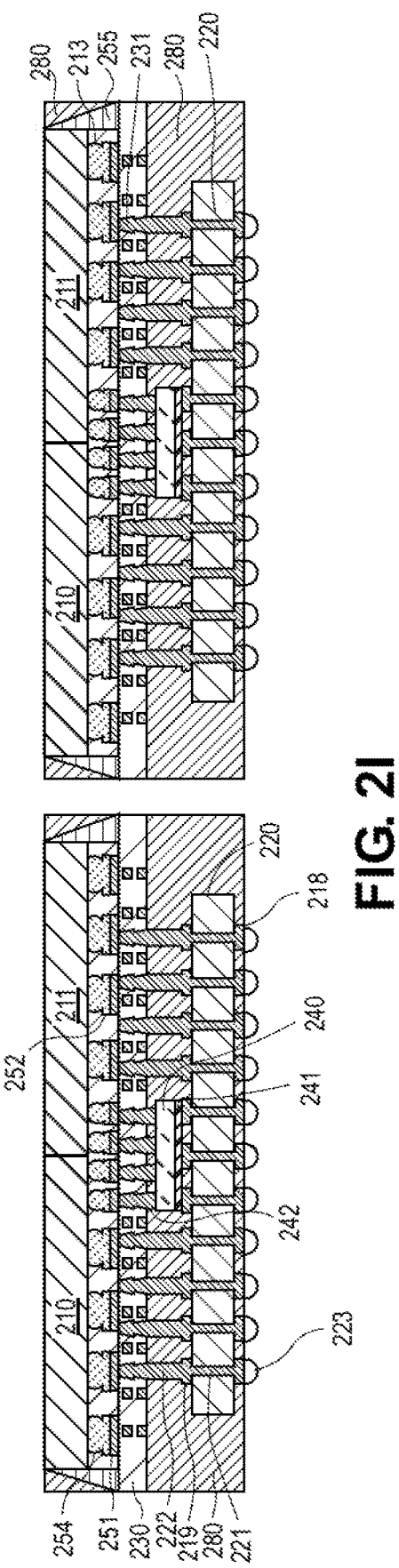

Referring now to FIG. 2I, a cross-sectional illustration of a semiconductor package 200 is shown, in accordance with an embodiment. In an embodiment, the semiconductor package 200 may singulate the plurality of patches (packages) to form an individual patch (or package) that may be substantially similar to the semiconductor package 100 described above in FIG. 1. The singulation of the patches of the semiconductor package 200 may be implemented by dicing, sawing, lasering, etc., the plurality of patches into one patch (as shown with the package on the left) and another package (as shown with the package on the right).

Figure 2J:
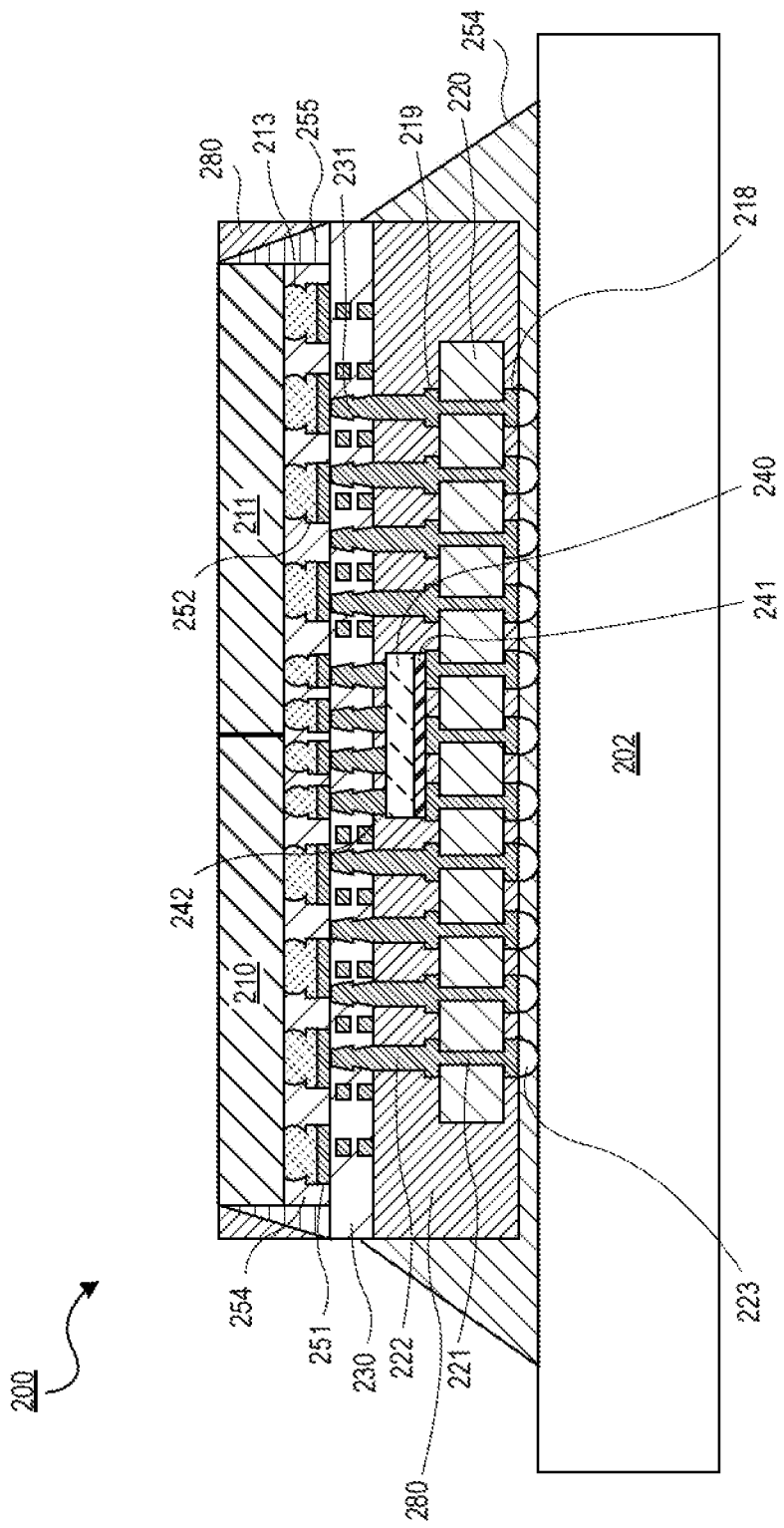

Referring now to FIG. 2J, a cross-sectional illustration of a semiconductor package 200 is shown, in accordance with an embodiment. In an embodiment, the first conductive pads 218 of the glass patch 220 may be disposed and coupled onto the top surface of a package substrate 202. The package substrate 202 may be substantially similar to the package substrate 102 described above in FIG. 1. Additionally, as described above, the underfill material 254 (or the first underfill material) may be disposed over the HDP substrate 230, the encapsulation layer 280, and the package substrate 202, where the underfill material 254 may be disposed between the glass patch 220 and the package substrate 202. The underfill material 254 may surround the HDP substrate 230, the encapsulation layer 280, and the first solder balls 223. The underfill material 254 of FIG. 2J may be substantially similar to the underfill material 254 described above in FIG. 2F.

Note that the semiconductor package 200 of FIGS. 2A-2J may include fewer or additional packaging components based on the desired packaging design.

Figure 3:
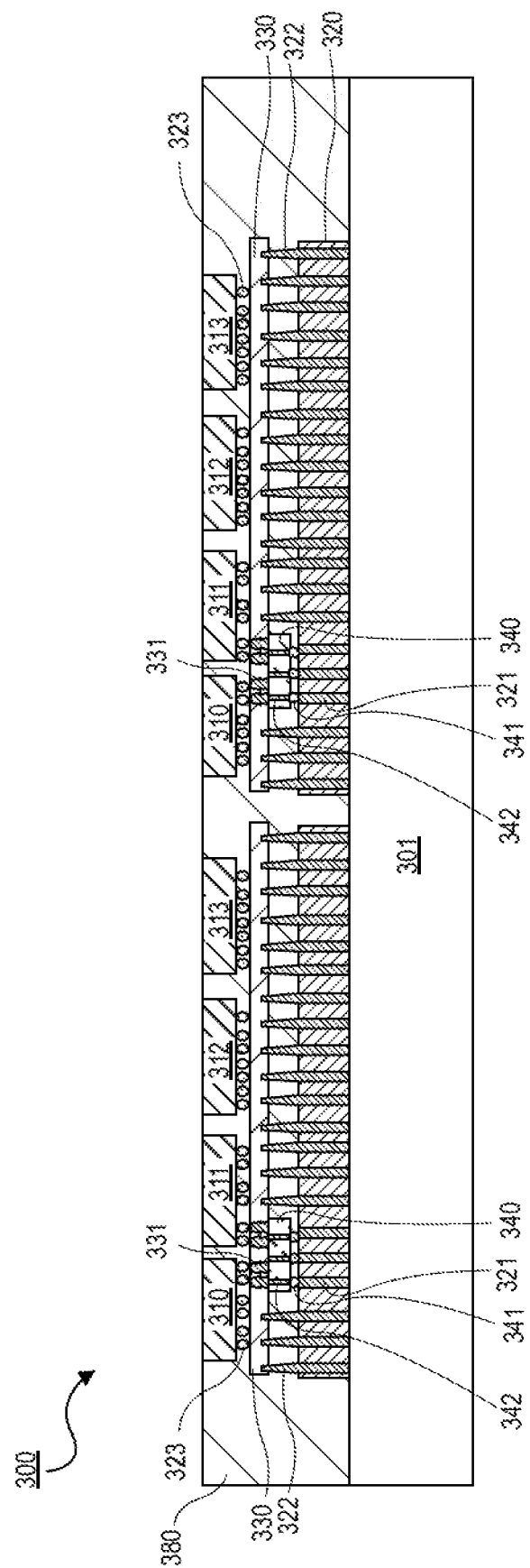
FIG. 3 is an illustration of a cross-sectional view of a semiconductor package with a plurality of dies, a plurality of HDP substrates, a plurality of bridges, a plurality of glass patches, and a substrate, according to one embodiment.

Referring now to FIG. 3, a cross-sectional illustration of a semiconductor package 300 is shown, in accordance with an embodiment. The semiconductor package 300 may be substantially similar to the semiconductor packages 100 and 200 of FIGS. 1 and 2A-2J, with the exception that a plurality of dies 310-313 are disposed and coupled onto the HDP substrate 330 with a plurality of second solder balls 323, and that a plurality of bridges 340 include a plurality of TSVs 342 and a plurality of first solder balls 341, thereby the TSVs 341 of the bridges 340 may be coupled (or soldered) directly to the TGVs 321 of the glass patches 320 to supply power directly to the input/output (I/O) circuits such as the dies 310-313 and/or the substrate 301.

Whereas two dies 110-111 are disposed and coupled onto the HDP substrate 130 in FIG. 1, the four dies 310-313 are communicatively coupled to both the HDP substrate 330 and the bridge 340 with ultrafine pitches in FIG. 3, thereby adding two (or more) additional desired ICs to improve the overall performance of the semiconductor package 300, while only using one bridge 340 and one glass patch 320 to thus maintain a substantially reduced overall thickness (or z-height) for the semiconductor package 300. Also, whereas the bridge 140 has the adhesive layer 141 without any TSVs in FIG. 1, the bridge 340 has the solder balls 341 with the TSVs 342 in FIG. 3, thereby providing power directly to the dies 310-313 and/or the substrate 301 to improve the overall power performance of the semiconductor package 300. While, in each patch, four dies 310-313, one HDP substrate 330, and one bridge 340 are illustrated, it is to be appreciated that, in each patch, any number of dies 310-313, HDP substrates 330, and bridges 340 may be disposed (or positioned) on/over/in the glass patch 320. Note that the semiconductor package 300 may be singulated from the two patches (or packages) into individual patches (or packages) as shown/described above in FIGS. 2I-2J.

As shown in FIG. 3, the semiconductor package 300 may include a plurality of glass patches 330 with TGVs 331 disposed on a substrate 301, where the substrate 301 may be a package substrate, a carrier, an interposer, and/or the like. In one embodiment, a plurality of bridges 340 with the first solder balls 341 and the TSVs 342 may be disposed and coupled onto the respective glass patches 320. Furthermore, a plurality of TMVs 322 may conductively couple the respective glass patches 320 to a plurality of HDP substrates 330, where the TMVs 322 may surround the respective bridges 340. In one embodiment, the TMVs 322 may have a thickness that is approximately equal to a thickness of the bridge 340 with the first solder balls 341. In one embodiment, a plurality of dies 310-313 may be disposed and coupled onto the HDP substrate 330, where a plurality of conductive interconnects 331 of the HDP substrate 330 may thus communicatively couple the dies 310-313 to the respective bridges 340. Furthermore, an encapsulation layer 380 may be disposed over the dies 310-313, the second solder balls 323, the HDP substrates 330, the TMVs 322, the bridges 340 with the first solder balls 341, the glass patches 320, and the substrate 301, where the encapsulation layer 380 may be planarized, and thus the top surface of the encapsulation layer 380 may be substantially coplanar to the top surfaces of the dies 310-313.

Note, as described above, the semiconductor package 300 may be substantially similar to the semiconductor package 100 described above in FIG. 1. Likewise, the components of the semiconductor package 300 described above are substantially similar to the components of the semiconductor package 100 described above in FIG. 1. Also, note that the semiconductor package 300 may include fewer or additional packaging components based on the desired packaging design.

Figure 4:
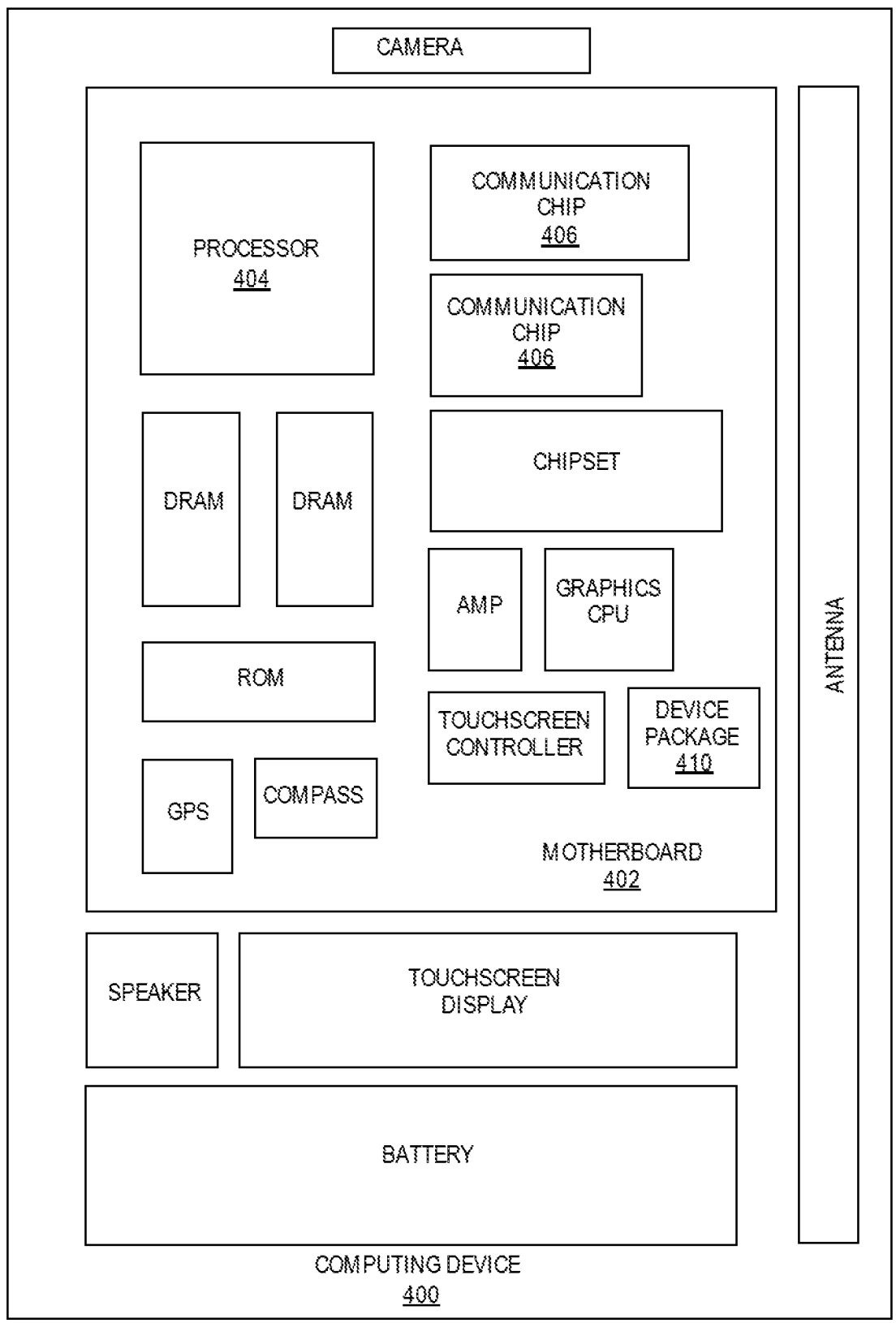
FIG. 4 is an illustration of a schematic block diagram illustrating a computer system that utilizes a semiconductor package with a plurality of dies, a HDP substrate, a bridge, a glass patch, and a package substrate, according to one embodiment.

FIG. 4 is an illustration of a schematic block diagram illustrating a computer system 400 that utilizes a device package 410 (or a semiconductor package) with a plurality of dies, a HDP substrate, a bridge, a glass patch, and a package substrate, according to one embodiment. FIG. 4 illustrates an example of computing device 400. Computing device 400 houses a motherboard 402. Motherboard 402 may include a number of components, including but not limited to processor 404, device package 410 (or semiconductor package), and at least one communication chip 406. Processor 404 is physically and electrically coupled to motherboard 402. For some embodiments, at least one communication chip 406 is also physically and electrically coupled to motherboard 402. For other embodiments, at least one communication chip 406 is part of processor 404.

Depending on its applications, computing device 400 may include other components that may or may not be physically and electrically coupled to motherboard 402. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

At least one communication chip 406 enables wireless communications for the transfer of data to and from computing device 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. At least one communication chip 406 may implement any of a number of wireless standards or protocols, including but not limited to Wi-Fi (IEEE 802.11 family), WiMAX (IEEE 802.112 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 400 may include a plurality of communication chips 406. For instance, a first communication chip 406 may be dedicated to shorter range wireless communications such as Wi-Fi and Bluetooth and a second communication chip 406 may be dedicated to longer range wireless communications such as GPS, EDGE, GPRS, CDMA, WiMAX, LTE, Ev-DO, and others.

Processor 404 of computing device 400 includes an integrated circuit die packaged within processor 404. Device package 410 may be a semiconductor package that may include, but is not limited to, a substrate, a package substrate, and/or a PCB. In one embodiment, device package 410 may be substantially similar to the semiconductor packages of FIGS. 1-3 described herein. Device package 410 may include dies, HDP substrates, bridges, glass patches, and package substrates as described herein (e.g., as illustrated and described above with the semiconductor packages of FIGS. 1-3)—or any other components from the figures described herein.

Note that device package 410 may be a single component/device, a subset of components, and/or an entire system, as the materials, features, and components may be limited to device package 410 and/or any other component of the computing device 400 that may need the solder-less coupled HDP substrates and bridges with ultrafine pitches as described herein (e.g., the motherboard 402, the processor 404, and/or any other component of the computing device 400 that may need the embodiments of the semiconductor packages described herein).

For certain embodiments, the integrated circuit die may be packaged with one or more devices on a package substrate that includes a thermally stable RFIC and antenna for use with wireless communications and the device package, as described herein, to reduce the z-height of the computing device. The term "processor" may refer to any device or portion of a device that processes electronic data from registers and/or memory to transform that electronic data into other electronic data that may be stored in registers and/or memory.

At least one communication chip 406 also includes an integrated circuit die packaged within the communication chip 406. For some embodiments, the integrated circuit die of the communication chip 406 may be packaged with one or more devices on a package substrate that includes one or more device packages, as described herein.

In the foregoing specification, embodiments have been described with reference to specific exemplary embodiments thereof. It should be borne in mind, however, that all of these and similar terms are to be associated with the appropriate physical quantities and are merely convenient labels applied to these quantities. It will be evident that various modifications may be made thereto without departing from the broader spirit and scope. The specification and drawings are, accordingly, to be regarded in an illustrative sense rather than a restrictive sense.

The following examples pertain to further embodiments. The various features of the different embodiments may be variously combined with some features included and others excluded to suit a variety of different applications.

The following examples pertain to further embodiments:

Example 1 is a semiconductor package, comprising: a bridge over a glass patch, wherein the bridge is coupled to the glass patch with an adhesive layer; a HDP substrate over the bridge and the glass patch, wherein the HDP substrate is conductively coupled to the glass patch with a plurality of TMVs; and a plurality of dies over the HDP substrate, wherein the HDP substrate includes a plurality of conductive interconnects that conductively couple the plurality of dies to the bridge and the glass patch.

In example 2, the subject matter of example 1 can optionally include that the bridge is an EMIB, and wherein the EMIB is communicatively coupled to the plurality of dies.

In example 3, the subject matter of examples 1-2 can optionally include that the glass patch includes a plurality of TGVs.

In example 4, the subject matter of examples 1-3 can optionally include that the glass patch includes a plurality of first conductive pads and a plurality of second conductive pads, and wherein the bridge includes a plurality of third conductive pads.

In example 5, the subject matter of examples 1-4 can optionally include that the plurality of first conductive pads are on a bottom surface of the glass patch, wherein the plurality of second conductive pads are on a top surface of the glass patch, wherein the plurality of third conductive pads are on a top surface of the bridge, wherein the adhesive layer of the bridge is directly coupled onto the top surface of the glass patch or the plurality of second conductive pads of the glass patch, wherein the plurality of TGVs vertically extend from the bottom surface to the top surface of the glass patch, and wherein the plurality of TGVs conductively couple the plurality of first conductive pads to the plurality of second conductive pads.

In example 6, the subject matter of examples 1-5 can optionally include the glass patch over a package substrate, wherein the plurality of first conductive pads of the glass patch are conductively coupled to the package substrate with a plurality of first solder balls; a first encapsulation layer over the plurality of TMVs, the plurality of first, second, and third conductive pads, the bridge, the adhesive layer, and the glass patch; a first underfill material over the package substrate, wherein the first underfill material is between the bottom surface of the glass patch and a top surface of the package substrate, wherein the first underfill material surrounds the first encapsulation layer and the plurality of first solder balls; a plurality of fourth conductive pads on the HDP substrate, wherein a surface finish layer is on the plurality of fourth conductive pads, wherein the surface finish layer and the plurality of fourth conductive pads are conductively coupled to the plurality of dies with a plurality of second solder balls; a second underfill material over the HDP substrate, wherein the second underfill material is between a bottom surface of the plurality of dies and a top surface of the HDP substrate, wherein the second underfill material surrounds the plurality of dies, the plurality of second solder balls, the plurality of fourth conductive pads, and the surface finish layer; and a second encapsulation layer over the plurality of dies, the second underfill material, and the HDP substrate.

In example 7, the subject matter of examples 1-6 can optionally include that the first encapsulation layer has a top surface that is substantially coplanar to top surfaces of the plurality of TMVs and top surfaces of the plurality of third conductive pads, and wherein the second encapsulation layer has a top surface that is substantially coplanar to top surfaces of the plurality of dies.

In example 8, the subject matter of examples 1-7 can optionally include that the plurality of TMVs have a thickness that is substantially equal to a thickness of the plurality of third conductive pads, the bridge, and the adhesive layer, wherein a first portion of the plurality of fourth conductive pads are positioned directly over the bridge, wherein a second portion of the plurality of fourth conductive pads are not positioned directly over the bridge, and wherein the first portion of the plurality of fourth conductive pads has a width that is less than a width of the second portion of the plurality of fourth conductive pads.

In example 9, the subject matter of examples 1-8 can optionally include one or more thermal devices over the top surfaces of the plurality of dies.

In example 10, the subject matter of examples 1-9 can optionally include that the EMIB includes a plurality of TSVs to couple the glass patch to the HDP substrate and the plurality of dies.

Example 11 is a method of forming a semiconductor package, comprising: disposing a glass patch over a carrier, wherein the glass patch is coupled to the carrier with a first adhesive layer; disposing a plurality of TMVs over the glass patch, wherein the plurality of TMVs surround a cavity that is formed over the glass patch; disposing a bridge into the cavity and over the glass patch, wherein the bridge is coupled to the glass patch with an adhesive layer; disposing a first encapsulation layer over the glass patch, the bridge, the adhesive layer, and the plurality of TMVs; disposing a HDP substrate over the bridge and the glass patch, wherein the HDP substrate is conductively coupled to the glass patch with the plurality of TMVs; disposing a plurality of dies over the HDP substrate, wherein the HDP substrate includes a plurality of conductive interconnects that conductively couple the plurality of dies to the bridge and the glass patch; and disposing a second encapsulation layer over the plurality of dies and the HDP substrate.

In example 12, the subject matter of example 11 can optionally include that the bridge is an EMIB, and wherein the EMIB is communicatively coupled to the plurality of dies, and wherein the glass patch includes a plurality of TGVs.

In example 13, the subject matter of examples 11-12 can optionally include that the glass patch includes a plurality of first conductive pads and a plurality of second conductive pads, and wherein the bridge includes a plurality of third conductive pads.

In example 14, the subject matter of examples 11-13 can optionally include that the plurality of first conductive pads are on a bottom surface of the glass patch, wherein the plurality of second conductive pads are on a top surface of the glass patch, wherein the plurality of third conductive pads are on a top surface of the bridge, wherein the adhesive layer of the bridge is directly coupled onto the top surface of the glass patch or the plurality of second conductive pads of the glass patch, wherein the plurality of TGVs vertically extend from the bottom surface to the top surface of the glass patch, and wherein the plurality of TGVs conductively couple the plurality of first conductive pads to the plurality of second conductive pads.

In example 15, the subject matter of examples 11-14 can optionally include removing the carrier to expose bottom surfaces of the plurality of first conductive pads of the glass patch, wherein the first encapsulation layer has a bottom surface that is substantially coplanar to the bottom surfaces of the plurality of first conductive pads, wherein the plurality of first conductive pads of the glass patch are conductively coupled to the package substrate with a plurality of first solder balls, and wherein the first encapsulation layer is disposed over the plurality of TMVs, the plurality of first, second, and third conductive pads, the bridge, the adhesive layer, and the glass patch; disposing a first underfill material over the package substrate, wherein the first underfill material is between the bottom surface of the glass patch and a top surface of the package substrate, wherein the first underfill material surrounds the first encapsulation layer and the plurality of first solder balls; disposing a plurality of fourth conductive pads on the HDP substrate, wherein a surface finish layer is on the plurality of fourth conductive pads, wherein the surface finish layer and the plurality of fourth conductive pads are conductively coupled to the plurality of dies with a plurality of second solder balls; and disposing a second underfill material over the HDP substrate, wherein the second underfill material is between a bottom surface of the plurality of dies and a top surface of the HDP substrate, wherein the second underfill material surrounds the plurality of dies, the plurality of second solder balls, the plurality of fourth conductive pads, and the surface finish layer.

In example 16, the subject matter of examples 11-15 can optionally include that the first encapsulation layer has a top surface that is substantially coplanar to top surfaces of the plurality of TMVs and top surfaces of the plurality of third conductive pads, and wherein the second encapsulation layer has a top surface that is substantially coplanar to top surfaces of the plurality of dies.

In example 17, the subject matter of examples 11-16 can optionally include that the plurality of TMVs have a thickness that is substantially equal to a thickness of the plurality of third conductive pads, the bridge, and the adhesive layer, wherein a first portion of the plurality of fourth conductive pads are positioned directly over the bridge, wherein a second portion of the plurality of fourth conductive pads are not positioned directly over the bridge, and wherein the first portion of the plurality of fourth conductive pads has a width that is less than a width of the second portion of the plurality of fourth conductive pads.

In example 18, the subject matter of examples 11-17 can optionally include disposing one or more thermal devices over the top surfaces of the plurality of dies.

In example 19, the subject matter of examples 11-18 can optionally include that the EMIB includes a plurality of TSVs to couple the glass patch to the HDP substrate and the plurality of dies.

Example 20 is a semiconductor package, comprising: a glass patch over a package substrate, wherein the glass patch includes a plurality of TGVs; a bridge over a glass patch, wherein the bridge includes a plurality of TSVs, and wherein the plurality of TSVs of the bridge are directly coupled to the plurality of TGVs of the glass patch with a plurality of first solder balls; a HDP substrate over the bridge and the glass patch, wherein the HDP substrate is conductively coupled to the glass patch with a plurality of TMVs, and wherein the HDP substrate has a width that is substantially equal to a width of the glass patch; a plurality of dies over the HDP substrate, wherein the HDP substrate includes a plurality of conductive interconnects that conductively couple the plurality of dies to the bridge and the glass patch; and a first encapsulation layer over the plurality of dies, the HDP substrate, the plurality of TMVs, the bridge, the plurality of first solder balls, the glass patch, and the package substrate, wherein the first encapsulation layer embeds the plurality of dies, the HDP substrate, the plurality of TMVs, the bridge, the plurality of first solder balls, and the glass patch, and wherein the first encapsulation layer has a top surface that is substantially coplanar to top surfaces of the plurality of dies.

In example 21, the subject matter of example 20 can optionally include that the bridge is an EMIB, wherein the EMIB is communicatively coupled to the plurality of dies, wherein the glass patch includes a plurality of first conductive pads and a plurality of second conductive pads, and wherein the bridge includes a plurality of third conductive pads.

In example 22, the subject matter of examples 20-21 can optionally include that the plurality of first conductive pads are on a bottom surface of the glass patch, wherein the plurality of second conductive pads are on a top surface of the glass patch, wherein the plurality of third conductive pads are on a top surface of the bridge, wherein the plurality of first solder balls of the bridge are directly coupled onto top surfaces of the plurality of TGVs of the glass patch or the plurality of second conductive pads of the glass patch, wherein the plurality of TGVs vertically extend from the bottom surface to the top surface of the glass patch, wherein the plurality of TGVs conductively couple the plurality of first conductive pads to the plurality of second conductive pads, and wherein the plurality of first conductive pads of the glass patch are conductively coupled to the package substrate with a plurality of second solder balls.

In example 23, the subject matter of examples 20-22 can optionally include a first underfill material over the package substrate, wherein the first underfill material is between the bottom surface of the glass patch and a top surface of the package substrate, wherein the first underfill material surrounds the first encapsulation layer and the plurality of second solder balls; a plurality of fourth conductive pads on the HDP substrate, wherein a surface finish layer is on the plurality of fourth conductive pads, wherein the surface finish layer and the plurality of fourth conductive pads are conductively coupled to the plurality of dies with a plurality of third solder balls, and wherein the first encapsulation layer surrounds the plurality of third solder balls, the plurality of fourth conductive pads, and the surface finish layer; and one or more thermal devices over the top surfaces of the plurality of dies and the top surface of the first encapsulation layer.

In example 24, the subject matter of examples 20-23 can optionally include that the plurality of TMVs have a thickness that is substantially equal to a thickness of the bridge and the plurality of first solder balls, wherein a first portion of the plurality of fourth conductive pads are positioned directly over the bridge, wherein a second portion of the plurality of fourth conductive pads are not positioned directly over the bridge, and wherein the first portion of the plurality of fourth conductive pads has a width that is less than a width of the second portion of the plurality of fourth conductive pads.

In example 25, the subject matter of examples 20-24 can optionally include that the plurality of TSVs of the bridge conductive couples the glass patch to the HDP substrate and the plurality of dies In the foregoing specification, methods and apparatuses have been described with reference to specific exemplary embodiments thereof. It will be evident that various modifications may be made thereto without departing from the broader spirit and scope. The specification and drawings are, accordingly, to be regarded in an illustrative sense rather than a restrictive sense.

What is claimed is:

1. A semiconductor package, comprising:
   a bridge over a glass patch, wherein the bridge is coupled to the glass patch with an adhesive layer;
   a high-density packaging (HDP) substrate over the bridge and the glass patch, wherein the HDP substrate is conductively coupled to the glass patch with a plurality of through mold vias (TMVs), wherein the HDP substrate comprises a plurality of redistribution layers; and
   a plurality of dies over the HDP substrate, wherein the HDP substrate includes a plurality of conductive interconnects that conductively couple the plurality of dies to the bridge and the glass patch.

2. The semiconductor package of claim 1, wherein the bridge is an embedded multi-die interconnect bridge (EMIB), and wherein the EMIB is communicatively coupled to the plurality of dies.

3. The semiconductor package of claim 2, wherein the EMIB includes a plurality of through silicon vias (TSVs) to couple the glass patch to the HDP substrate and the plurality of dies.

4. The semiconductor package of claim 1, wherein the glass patch includes a plurality of through glass vias (TGVs).

5. The semiconductor package of claim 4, wherein the glass patch includes a plurality of first conductive pads and a plurality of second conductive pads, and wherein the bridge includes a plurality of third conductive pads.

6. The semiconductor package of claim 5, wherein the plurality of first conductive pads are on a bottom surface of the glass patch, wherein the plurality of second conductive pads are on a top surface of the glass patch, wherein the plurality of third conductive pads are on a top surface of the bridge, wherein the adhesive layer of the bridge is directly coupled onto the top surface of the glass patch or the plurality of second conductive pads of the glass patch, wherein the plurality of TGVs vertically extend from the bottom surface to the top surface of the glass patch, and wherein the plurality of TGVs conductively couple the plurality of first conductive pads to the plurality of second conductive pads.

7. The semiconductor package of claim 6, further comprising:
   the glass patch over a package substrate, wherein the plurality of first conductive pads of the glass patch are conductively coupled to the package substrate with a plurality of first solder balls;
   a first encapsulation layer over the plurality of TMVs, the plurality of first, second, and third conductive pads, the bridge, the adhesive layer, and the glass patch;
   a first underfill material over the package substrate, wherein the first underfill material is between the bottom surface of the glass patch and a top surface of the package substrate, wherein the first underfill material surrounds the first encapsulation layer and the plurality of first solder balls;
   a plurality of fourth conductive pads on the HDP substrate, wherein a surface finish layer is on the plurality of fourth conductive pads, wherein the surface finish layer and the plurality of fourth conductive pads are conductively coupled to the plurality of dies with a plurality of second solder balls;
   a second underfill material over the HDP substrate, wherein the second underfill material is between a bottom surface of the plurality of dies and a top surface of the HDP substrate, wherein the second underfill material surrounds the plurality of dies, the plurality of second solder balls, the plurality of fourth conductive pads, and the surface finish layer; and
   a second encapsulation layer over the plurality of dies, the second underfill material, and the HDP substrate.

8. The semiconductor package of claim 7, wherein the first encapsulation layer has a top surface that is substantially coplanar to top surfaces of the plurality of TMVs and top surfaces of the plurality of third conductive pads, and wherein the second encapsulation layer has a top surface that is substantially coplanar to top surfaces of the plurality of dies.

9. The semiconductor package of claim 8, further comprising one or more thermal devices over the top surfaces of the plurality of dies.

10. The semiconductor package of claim 7, wherein the plurality of TMVs have a thickness that is substantially equal to a thickness of the plurality of third conductive pads, the bridge, and the adhesive layer, wherein a first portion of the plurality of fourth conductive pads are positioned directly over the bridge, wherein a second portion of the plurality of fourth conductive pads are not positioned directly over the bridge, and wherein the first portion of the plurality of fourth conductive pads has a width that is less than a width of the second portion of the plurality of fourth conductive pads.

11. A method of forming a semiconductor package, comprising:
   disposing a glass patch over a carrier, wherein the glass patch is coupled to the carrier with a first adhesive layer;
   disposing a plurality of through mold vias (TMVs) over the glass patch, wherein the plurality of TMVs surround a cavity that is formed over the glass patch;
   disposing a bridge into the cavity and over the glass patch, wherein the bridge is coupled to the glass patch with an adhesive layer;
   disposing a first encapsulation layer over the glass patch, the bridge, the adhesive layer, and the plurality of TMVs;
   disposing a high-density packaging (HDP) substrate over the bridge and the glass patch, wherein the HDP substrate is conductively coupled to the glass patch with the plurality of TMVs;
   disposing a plurality of dies over the HDP substrate, wherein the HDP substrate includes a plurality of conductive interconnects that conductively couple the plurality of dies to the bridge and the glass patch; and
   disposing a second encapsulation layer over the plurality of dies and the HDP substrate.

12. The method of claim 11, wherein the bridge is an embedded multi-die interconnect bridge (EMIB), and wherein the EMIB is communicatively coupled to the plurality of dies, and wherein the glass patch includes a plurality of through glass vias (TGVs).

13. The method of claim 12, wherein the glass patch includes a plurality of first conductive pads and a plurality of second conductive pads, and wherein the bridge includes a plurality of third conductive pads.

14. The method of claim 13, wherein the plurality of first conductive pads are on a bottom surface of the glass patch, wherein the plurality of second conductive pads are on a top surface of the glass patch, wherein the plurality of third conductive pads are on a top surface of the bridge, wherein the adhesive layer of the bridge is directly coupled onto the top surface of the glass patch or the plurality of second conductive pads of the glass patch, wherein the plurality of TGVs vertically extend from the bottom surface to the top surface of the glass patch, and wherein the plurality of TGVs conductively couple the plurality of first conductive pads to the plurality of second conductive pads.

15. The method of claim 14, further comprising:
removing the carrier to expose bottom surfaces of the plurality of first conductive pads of the glass patch, wherein the first encapsulation layer has a bottom surface that is substantially coplanar to the bottom surfaces of the plurality of first conductive pads, wherein the plurality of first conductive pads of the glass patch are conductively coupled to the package substrate with a plurality of first solder balls, and wherein the first encapsulation layer is disposed over the plurality of TMVs, the plurality of first, second, and third conductive pads, the bridge, the adhesive layer, and the glass patch;
disposing a first underfill material over the package substrate, wherein the first underfill material is between the bottom surface of the glass patch and a top surface of the package substrate, wherein the first underfill material surrounds the first encapsulation layer and the plurality of first solder balls;
disposing a plurality of fourth conductive pads on the HDP substrate, wherein a surface finish layer is on the plurality of fourth conductive pads, wherein the surface finish layer and the plurality of fourth conductive pads are conductively coupled to the plurality of dies with a plurality of second solder balls; and
disposing a second underfill material over the HDP substrate, wherein the second underfill material is between a bottom surface of the plurality of dies and a top surface of the HDP substrate, wherein the second underfill material surrounds the plurality of dies, the plurality of second solder balls, the plurality of fourth conductive pads, and the surface finish layer.

16. The method of claim 15, wherein the first encapsulation layer has a top surface that is substantially coplanar to top surfaces of the plurality of TMVs and top surfaces of the plurality of third conductive pads, and wherein the second encapsulation layer has a top surface that is substantially coplanar to top surfaces of the plurality of dies.

17. The method of claim 16, wherein the plurality of TMVs have a thickness that is substantially equal to a thickness of the plurality of third conductive pads, the bridge, and the adhesive layer, wherein a first portion of the plurality of fourth conductive pads are positioned directly over the bridge, wherein a second portion of the plurality of fourth conductive pads are not positioned directly over the bridge, and wherein the first portion of the plurality of fourth conductive pads has a width that is less than a width of the second portion of the plurality of fourth conductive pads.

18. The method of claim 17, further comprising disposing one or more thermal devices over the top surfaces of the plurality of dies.

19. The method of claim 12, wherein the EMIB includes a plurality of TSVs to couple the glass patch to the HDP substrate and the plurality of dies.

20. A semiconductor package, comprising:
a glass patch over a package substrate, wherein the glass patch includes a plurality of through glass vias (TGVs);
a bridge over a glass patch, wherein the bridge includes a plurality of through silicon vias (TSVs), and wherein the plurality of TSVs of the bridge are directly coupled to the plurality of TGVs of the glass patch with a plurality of first solder balls;
a high-density packaging (HDP) substrate over the bridge and the glass patch, wherein the HDP substrate is conductively coupled to the glass patch with a plurality of through mold vias (TMVs), and wherein the HDP substrate has a width that is substantially equal to a width of the glass patch;
a plurality of dies over the HDP substrate, wherein the HDP substrate includes a plurality of conductive interconnects that conductively couple the plurality of dies to the bridge and the glass patch; and
a first encapsulation layer over the plurality of dies, the HDP substrate, the plurality of TMVs, the bridge, the plurality of first solder balls, the glass patch, and the package substrate, wherein the first encapsulation layer embeds the plurality of dies, the HDP substrate, the plurality of TMVs, the bridge, the plurality of first solder balls, and the glass patch, and wherein the first encapsulation layer has a top surface that is substantially coplanar to top surfaces of the plurality of dies.

21. The semiconductor package of claim 20, wherein the bridge is an embedded multi-die interconnect bridge (EMIB), wherein the EMIB is communicatively coupled to the plurality of dies, wherein the glass patch includes a plurality of first conductive pads and a plurality of second conductive pads, and wherein the bridge includes a plurality of third conductive pads.

22. The semiconductor package of claim 21, wherein the plurality of first conductive pads are on a bottom surface of the glass patch, wherein the plurality of second conductive pads are on a top surface of the glass patch, wherein the plurality of third conductive pads are on a top surface of the bridge, wherein the plurality of first solder balls of the bridge are directly coupled onto top surfaces of the plurality of TGVs of the glass patch or the plurality of second conductive pads of the glass patch, wherein the plurality of TGVs vertically extend from the bottom surface to the top surface of the glass patch, wherein the plurality of TGVs conductively couple the plurality of first conductive pads to the plurality of second conductive pads, and wherein the plurality of first conductive pads of the glass patch are conductively coupled to the package substrate with a plurality of second solder balls.

23. The semiconductor package of claim 22, further comprising:
a first underfill material over the package substrate, wherein the first underfill material is between the bottom surface of the glass patch and a top surface of the package substrate, wherein the first underfill material surrounds the first encapsulation layer and the plurality of second solder balls;
a plurality of fourth conductive pads on the HDP substrate, wherein a surface finish layer is on the plurality of fourth conductive pads, wherein the surface finish layer and the plurality of fourth conductive pads are conductively coupled to the plurality of dies with a plurality of third solder balls, and wherein the first encapsulation layer surrounds the plurality of third solder balls, the plurality of fourth conductive pads, and the surface finish layer; and one or more thermal devices over the top surfaces of the plurality of dies and the top surface of the first encapsulation layer.

24. The semiconductor package of claim 23, wherein the plurality of TMVs have a thickness that is substantially equal to a thickness of the bridge and the plurality of first solder balls, wherein a first portion of the plurality of fourth conductive pads are positioned directly over the bridge, wherein a second portion of the plurality of fourth conductive pads are not positioned directly over the bridge, and wherein the first portion of the plurality of fourth conductive pads has a width that is less than a width of the second portion of the plurality of fourth conductive pads.

25. The semiconductor package of claim 24, wherein the plurality of TSVs of the bridge conductive couples the glass patch to the HDP substrate and the plurality of dies.

\* \* \* \* \*